United States Patent
Li et al.

(10) Patent No.: US 10,276,710 B1
(45) Date of Patent: Apr. 30, 2019

(54) HIGH VOLTAGE TRANSISTOR AND FABRICATION METHOD THEREOF

(71) Applicant: United Microelectronics Corp., Hsinchu (TW)

(72) Inventors: Shin-Hung Li, Nantou County (TW); Chang-Po Hsiung, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/965,267

(22) Filed: Apr. 27, 2018

(30) Foreign Application Priority Data

Mar. 22, 2018 (CN) .......................... 2018 1 0239017

(51) Int. Cl.
| | | |
|---|---|---|
| H01L 29/78 | (2006.01) | |
| H01L 21/762 | (2006.01) | |
| H01L 29/06 | (2006.01) | |
| H01L 29/423 | (2006.01) | |
| H01L 29/08 | (2006.01) | |
| H01L 29/66 | (2006.01) | |

(52) U.S. Cl.
CPC .... *H01L 29/7816* (2013.01); *H01L 21/76224* (2013.01); *H01L 29/0653* (2013.01); *H01L 29/086* (2013.01); *H01L 29/0878* (2013.01); *H01L 29/42356* (2013.01); *H01L 29/42364* (2013.01); *H01L 29/66681* (2013.01)

(58) Field of Classification Search
CPC .................................................... H01L 29/7816
USPC ............................................................ 257/339
See application file for complete search history.

(56) References Cited

U.S. PATENT DOCUMENTS

| | | | |
|---|---|---|---|
| 5,536,675 A | 7/1996 | Bohr | |
| 5,950,093 A | 9/1999 | Wei | |
| 6,624,496 B2 | 9/2003 | Ku et al. | |
| 7,067,365 B1* | 6/2006 | Lee | H01L 21/823418 257/E21.427 |
| 7,157,339 B2 | 1/2007 | Lim et al. | |
| 8,815,703 B2* | 8/2014 | Huang | H01L 21/76232 257/E21.546 |
| 9,577,069 B1* | 2/2017 | Pu | H01L 29/0649 |
| 2006/0270134 A1* | 11/2006 | Lee | H01L 21/823418 438/197 |
| 2009/0102010 A1* | 4/2009 | Ema | H01L 21/76232 257/506 |
| 2009/0278208 A1* | 11/2009 | Chang | H01L 21/76229 257/392 |
| 2016/0336417 A1 | 11/2016 | Hsiao et al. | |

* cited by examiner

*Primary Examiner* — Igwe U Anya
(74) *Attorney, Agent, or Firm* — J.C. Patents

(57) ABSTRACT

A high voltage transistor including a substrate is provided, and the substrate has an indent region. A doped region is disposed in the substrate at both sides of the indent region. A shallow trench isolation (STI) structure is disposed in the doped region of the substrate, at a periphery region of the indent region, wherein a portion of a bottom of the STI structure within the indent region has a protruding part down into the substrate. A gate insulating layer is disposed on the substrate at a central region of the indent region other than the STI structure, wherein the gate insulating layer has a protruding portion. A gate structure is disposed on the gate insulating layer and the STI structure within the indent region, covering the protruding portion of the gate insulating layer.

20 Claims, 5 Drawing Sheets

HIGH VOLTAGE TRANSISTOR AND FABRICATION METHOD THEREOF

CROSS-REFERENCE TO RELATED APPLICATION

This application claims the priority benefit of China application serial no. 201810239017.0, filed on Mar. 22, 2018. The entirety of the above-mentioned patent application is hereby incorporated by reference herein and made a part of this specification.

BACKGROUND OF THE INVENTION

Field of the Invention

The invention relates to a semiconductor manufacturing technique, and particularly relates to a high voltage transistor and a fabrication method thereof.

Description of Related Art

To meet the need of multifunction of electronic devices, electronic circuits require more extensive control functions, where implementation of some functions requires the electronic circuit to be operated under a high voltage. Transistors used in the high voltage electronic circuits need to be able to operate in a high voltage range, and a voltage range thereof is, for example, above 20V. Therefore, a semiconductor structure of the high voltage transistor is different to a semiconductor structure of the transistor operated under a low voltage.

As the structure of the high voltage transistor is operated in the high voltage range, a gate insulating layer thereof requires a larger thickness, so as to maintain a good insulation effect under the high voltage operation. Doped structures serving as source/drain (S/D) terminals are located two sides of the gate structure. Due to the high voltage operation, the doped structure further has a Shallow Trench Isolation (STI) structure, which is combined with the gate insulating layer to achieve the insulation effect.

While a size of the high voltage transistor is greatly reduced, good performance of the transistor under the high voltage is required to be maintained, and different designs of some structures probably substantially improve device performance. However, regarding the method of embedding the STI structure in the doped structure, the insulation effect thereof still requires further research and development.

SUMMARY OF THE INVENTION

The invention is directed to high voltage transistor structure, in which through a design of a trench isolation structure, an insulation effect of a gate of the high voltage transistor is improved.

In an embodiment, the invention provides a high voltage transistor including a substrate. The substrate has an indent region. A doped region is disposed in the substrate at both sides of the indent region. A shallow trench isolation structure is disposed in the doped region of the substrate at a periphery region of the indent region, where a portion of a bottom of the shallow trench isolation structure within the indent region has a protruding part down into the substrate. A gate insulating layer is disposed on the substrate at a central region of the indent region other than the shallow trench isolation structure, where the gate insulating layer has a protruding portion. A gate structure is disposed on the gate insulating layer and the shallow trench isolation structure within the indent region, and covers the protruding portion of the gate insulating layer.

In an embodiment, in the high voltage transistor, the gate insulating layer and the shallow trench isolation structure are combined together.

In an embodiment, in the high voltage transistor, a top of the protruding portion of the gate insulating layer is lower than a surface of the substrate outside the indent region.

In an embodiment, in the high voltage transistor, the doped region includes a doped base region and a heavily doped region, the heavily doped region is located on the top of the doped region, and is located outside the shallow trench isolation structure relative to the gate structure, and the doped base region and the heavily doped region are a first conductive type.

In an embodiment, the high voltage transistor further includes a doped well region surrounding the doped region, where the doped well region is a second conductive type opposite to the first conductive type.

In an embodiment, the high voltage transistor further includes a general shallow trench isolation structure located in the substrate at periphery of the doped region for isolating the doped region.

In an embodiment, in the high voltage transistor, a top of the gate structure declines according to a depth of the indent region.

In an embodiment, in the high voltage transistor, the gate structure is a ⊓-shape cap covering the gate insulating layer.

In an embodiment, in the high voltage transistor, the protruding part of the shallow trench isolation structure has a protruding depth according to a depth of the indent region of the substrate.

In an embodiment, in the high voltage transistor, the protruding part of the shallow trench isolation structure has a protruding depth, where a ratio for the protruding depth of the protruding part to a depth of the shallow trench isolation structure is between 1/4 and 1/6.

In an embodiment, in the high voltage transistor, the protruding part of the shallow trench isolation structure has a width, and a ratio for the width of the protruding part to a width of the shallow trench isolation structure is between 1/2 and 1/5.

An embodiment of the invention provides a method for fabricating a high voltage transistor including: providing a substrate, where the substrate has an indent region; forming a shallow trench isolation structure in the substrate at a periphery region of the indent region, where a portion of a bottom of the shallow trench isolation structure within the indent region has a protruding part down into the substrate; forming a gate insulating layer on the substrate at a central region of the indent region other than the shallow trench isolation structure, where the gate insulating layer has a protruding portion; forming a gate structure on the gate insulating layer and the shallow trench isolation structure within the indent region for covering the protruding portion of the gate insulating layer; and forming a doped region in the substrate at both sides of the indent region for surrounding the shallow trench isolation structure.

In an embodiment, in the method for fabricating the high voltage transistor, the gate insulating layer and the shallow trench isolation structure are combined together.

In an embodiment, in the method for fabricating the high voltage transistor, a top of the protruding portion of the gate insulating layer is lower than a surface of the substrate outside the indent region.

In an embodiment, in the method for fabricating the high voltage transistor, the doped region includes a doped base region and a heavily doped region, where the heavily doped region is located at the top of the doped region, and is located outside the shallow trench isolation structure relative to the gate structure, and the doped base region and the heavily doped region are first conductive type.

In an embodiment, the method for fabricating the high voltage transistor further includes forming a doped well region surrounding the doped region, where the doped well region is a second conductive type opposite to the first conductive type.

In an embodiment, the method for fabricating the high voltage transistor further includes forming a general shallow trench isolation structure in the substrate at periphery of the doped region for isolating the doped region.

In an embodiment, in the method for fabricating the high voltage transistor, a top of the gate structure declines according to a depth of the indent region.

In an embodiment, in the method for fabricating the high voltage transistor, the gate structure is a ⊓-shape cap covering the gate insulating layer.

In an embodiment, in the method for fabricating the high voltage transistor, the protruding part of the shallow trench isolation structure has a protruding depth according to a depth of the indent region of the substrate.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The invention relates to a high voltage transistor, the invention makes a further investigation on a design of configuring a shallow trench isolation (STI) structure in a doped structure of source/drain terminals, and viewing in a cross-sectional view, a sharp corner structure exists at a bottom edge of the STI structure to produce an excessive electric field of such region, which at least result in easy occurrence of current leakage.

The invention provides improvements to the STI structure, i.e. one side of the bottom of the STI structure close to a gate insulating layer has a deeper protruding structure to construct a step-like structure. The protruding structure may flat the sharp corner structure at periphery of the bottom of the STI structure, such that the electric field is more uniform to reduce a sharp corner effect.

Moreover, a height of the gate insulating layer is lower than a height of a substrate at other region, so that a height of a gate structure on the gate insulating layer is also lower, which may avoid partial removal of the gate structure in subsequent other fabrication processes.

Some embodiments are provided below to describe the invention in detail, though the invention is not limited to the provided embodiments.

Figure 1:
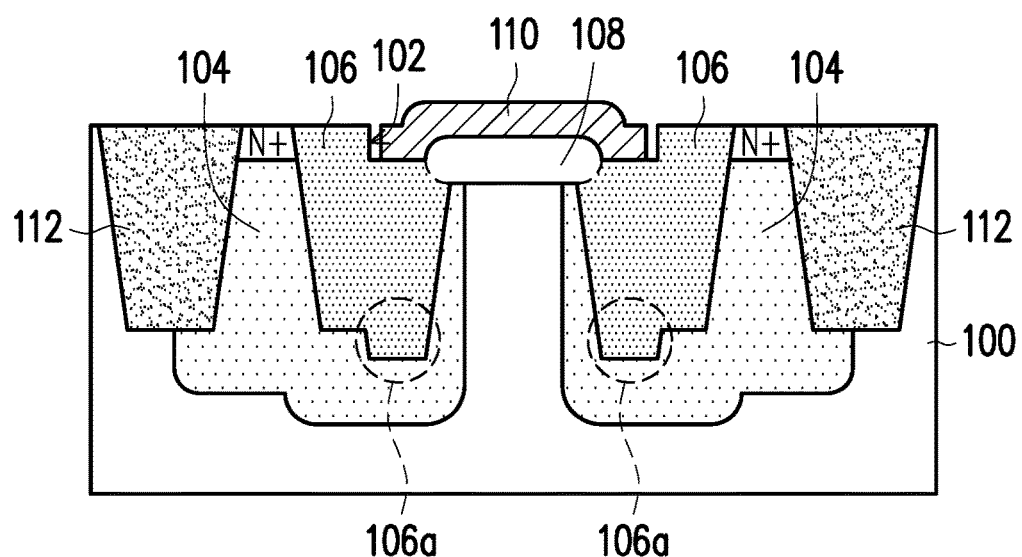
FIG. 1 is a cross-sectional view of a high voltage transistor according to an embodiment of the invention.

FIG. 1 is a cross-sectional view of a high voltage transistor according to an embodiment of the invention. Referring to FIG. 1, the structure of the high voltage transistor is first described. A substrate 100 serving as a base of the structure is, for example, a silicon substrate. Based on a conductive type of the high voltage transistor, the substrate 100 of FIG. 1, for example represents a doped well region. Taking the transistor of an N-conductive type as an example, the substrate 100 represents a high voltage P-type doped well region.

Regarding an overall structure, the high voltage transistor includes the substrate 100. The substrate 100 has an indent region 102. A doped region 104 is disposed in the substrate 100 at both sides of the indent region 102. A conductive type of the doped region 104 is opposite to a conductive type of the substrate 100. Taking the transistor of the N-conductive type as an example, the substrate 100 is the high voltage P-type doped well region, and the doped region 104 at both sides is an N-type doped well region, which serves as a source terminal and a drain terminal of the transistor. Moreover, a top surface of the doped region 104 has a heavily doped region N+, which is used for connecting an external operating voltage.

A STI structure 106 is disposed in the doped region 104 of the substrate 100 at a periphery region of the indent region 102. It should be noted that a portion of a bottom of the STI structure 106 within the indent region 102 has a protruding part 106a down into the substrate 100. The protruding part 106a may flat a sharp corner at a bottom edge of the STI structure 106, which avails smoothing an electric field distribution at the bottom edge to improve quality and performance of the high voltage transistor. Moreover, a STI structure 112 is a structure used for isolating the high voltage transistor at periphery.

The gate insulating layer 108 is formed by oxidating an exposed surface of the substrate 100, which is located at a central region of the indent region 102, and is located at the central region of the indent region 102 other than the STI structure 106. Based on an oxidation process, the gate insulating layer 108 is required to have an insulating layer that is thick enough to cope with a high voltage operation, so that the gate insulating layer 108 has a protruding portion. However, based on the formation of the indent region 102 of the invention, a height of the gate insulating layer 108 is lower than a height of the substrate 100 at the region outside the indent region 102. Moreover, the gate insulating layer 108 and the STI structure 106 may be connected and combined to form an insulating structure.

A gate structure 110 is disposed on the gate insulating layer 108 and the STI structure 106 within the indent region 102, and covers the protruding portion of the gate insulating layer 108. In this way, the gate structure 110 is, for example, a structure containing a ⊓-shape cap.

A protruding depth is used for describing the protruding part 106a of the STI structure 106, and a ratio for the protruding depth of the protruding part 106a to a depth of the STI structure 106 is, for example, between 1/4 and 1/6.

Moreover, regarding a width of the protruding part 106a of the STI structure 106, a ratio for the width of the protruding part 106a to a width of the STI structure 106 is, for example, between 1/2 and 1/5.

The STI structure 106 of the invention has the protruding part 106a at the internal bottom edge, which may smooth a distribution of the electric field in the high voltage operation.

Moreover, due to formation of the indent region 102, the height of the gate insulating layer 106 may be decreased, and the height of the gate structure 110 may be accordingly decreased, so as to avoid probable partial removal of the gate structure 110 in subsequent fabrication processes.

Some embodiments are provided to describe a method for fabricating the high voltage transistor. FIG. 2 to FIG. 10 are cross-sectional views of a flow the method for fabricating the high voltage transistor according to an embodiment of the invention.

Figure 2:
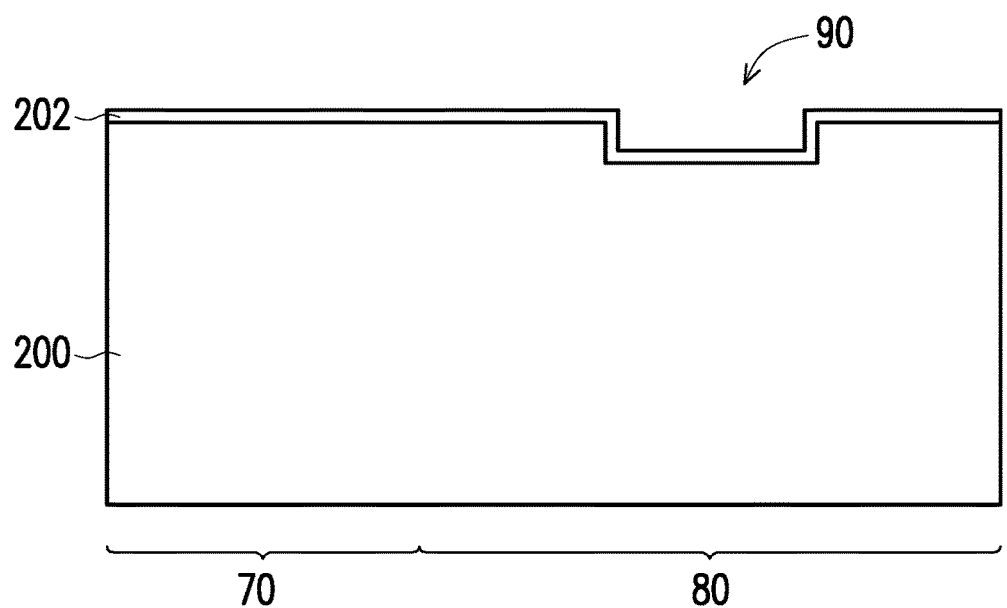
FIG. 2 to FIG. 10 are cross-sectional views of a flow a method for fabricating the high voltage transistor according to an embodiment of the invention.

Referring to FIG. 2, an element isolation region 70 and a high voltage element region 80 are, for example, planed on the substrate 200. In this case, taking frication of a transistor element as an example, in response to fabrication of the high voltage transistor, the high voltage element region 80 of the substrate 200 is first doped to form a high voltage doped well region. In the invention, regarding the structure required by the high voltage transistor, an initial indent region 90 is first formed in the high voltage element region 80. Then, a pad oxide layer 202 is formed on a surface of the substrate 200.

Figure 3:
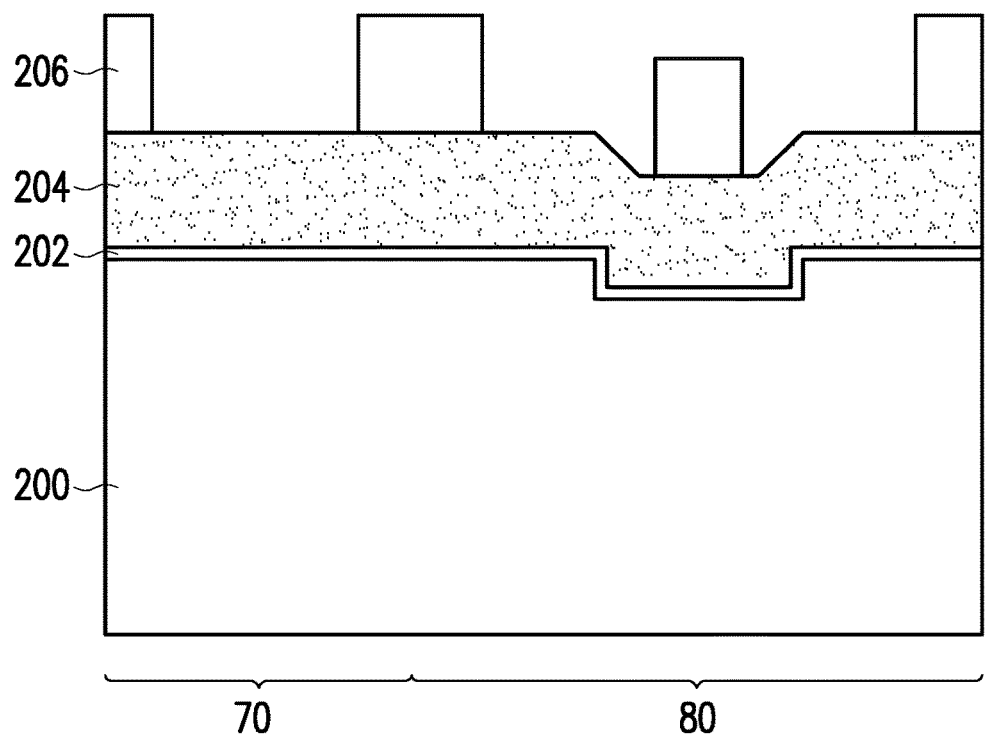

Referring to FIG. 3, a nitride layer 204, for example, a silicon nitride layer 204 is then formed on the pad oxide layer 202. A patterned photoresist layer 206 is formed on the nitride layer 204 to serve as an etching mask layer. In this case, the region that is not covered by the photoresist layer 206 is the position expected to be subsequently formed with the STI structure. Regarding the indent region 90 in the high voltage element region 80, the photoresist layer 206 covers a central region of the indent region 90 rather than completely covering the indent region 90.

Figure 4:
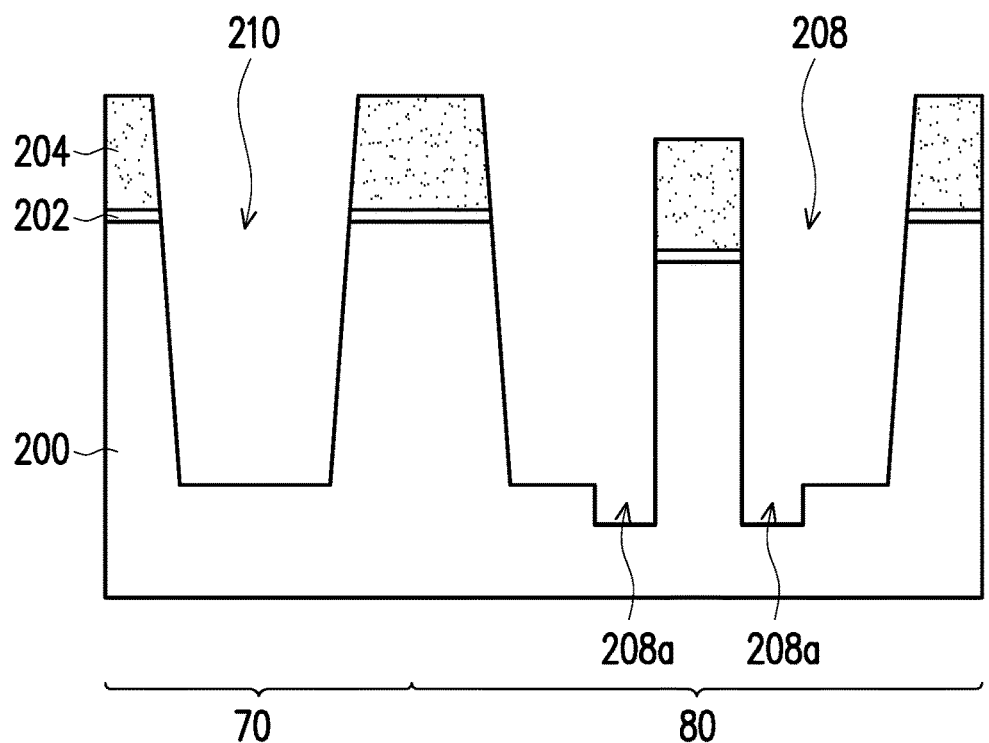

Referring to FIG. 4, the photoresist layer 206 is taken as the etching mask layer to perform a non-isotropic etching process to etch the nitride layer 204, the pad oxide layer 202 and the substrate 200, so as to form shallow trenches 208, 210. The shallow trench 208 is located in the high voltage element region 80, and the shallow trench 210 is located in the element isolation region 70. It should be noted that since the indent region 90 is pre-formed in the high voltage element region 80 of the substrate 200, an indent effect of the indent region 90 may be also appeared at a bottom of the shallow trench 208 to form a bottom indent 208a.

Figure 5:
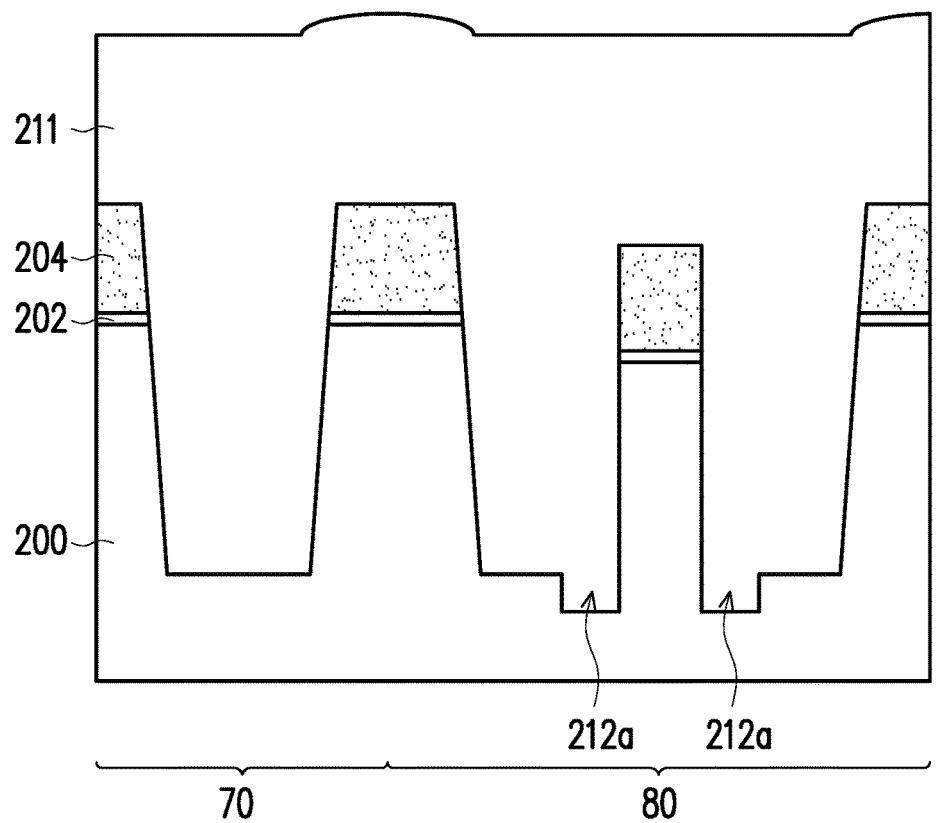

Referring to FIG. 5, an insulating layer 211 is formed to cover the substrate 200 and fill in the shallow trench 210 of the element isolation region 70 and the shallow trench 80 of the high voltage element region 80. Since the shallow trench 80 has the bottom indent 208a, the insulating layer 211 is also filled in the bottom indent 208a of the shallow trench 208 of FIG. 4 to form a protruding part 212a down into the substrate 100. A material of the insulating layer 211 is a dielectric material, for example, silicon oxide.

Figure 6:
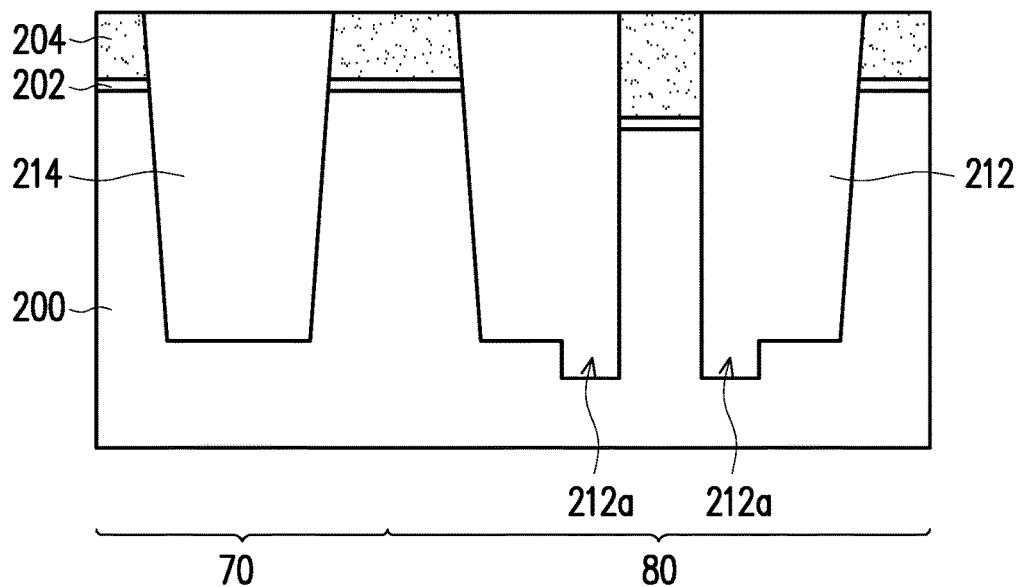

Referring to FIG. 6, a grinding process is then performed to grind the insulating layer 211 until the nitride layer 204 is exposed, and meanwhile reach a flat surface of the structure. Since the nitride layer 204 of the indent region 90 is lower, the grinding process is stopped at the nitride layer 204 of the indent region 90. A part of the insulating layer 211 remained in the shallow trench 208 constructs an STI structure 212. The STI structure 212 includes the protruding part 212a protruding at the bottom. A part of the insulating layer 211 remained in the shallow trench 210 constructs an STI structure 214 of a general device.

Figure 7:
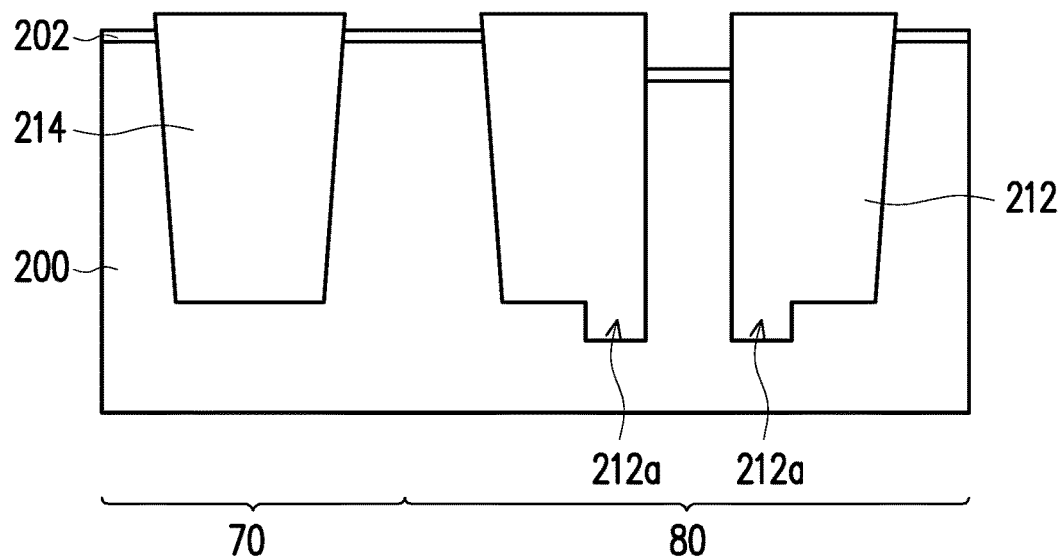
Figure 8:
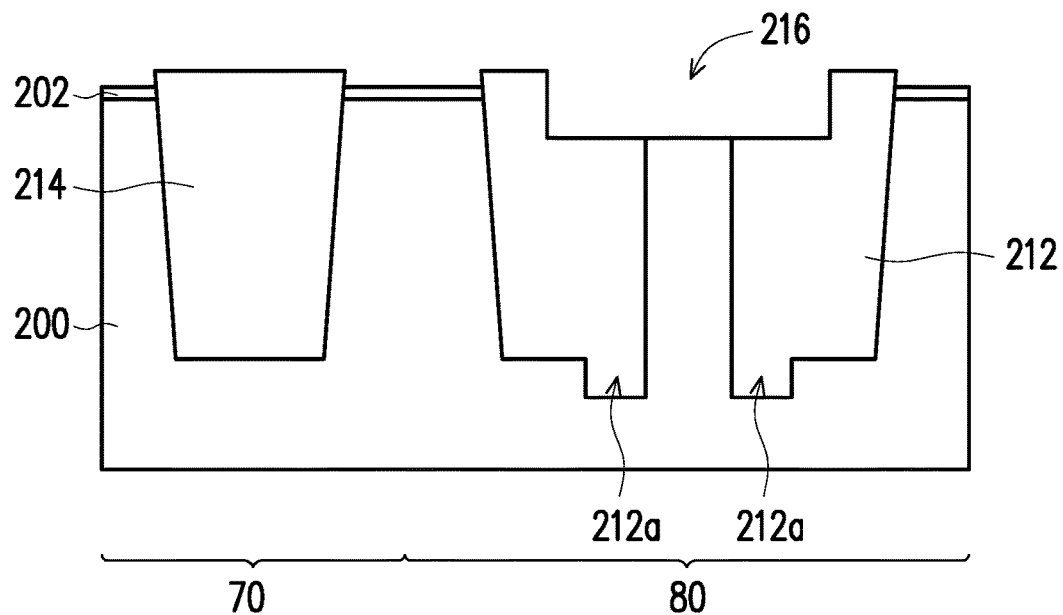

Referring to FIG. 7, through an etching process, the nitride layer 204 is removed to expose the pad oxide layer 202. Referring to FIG. 8, a process of fabricating the high voltage transistor at the high voltage element region 80 is described below. In order to form the gate insulating layer, a cleaning process is generally performed to remove sundries such as oxides on the surface of the substrate 200. Regarding fabrication of the high voltage transistor at the high voltage element region 80 in collaboration with the mask of the photoresist layer, regional cleaning for the high voltage element is performed on the high voltage element region 80. After the cleaning process, the pad oxide layer 202 on the substrate 200 and a part of the STI structure 212 are moved to form an indent region 216. The indent region 216 is located above the indent region 90 of FIG. 2. A silicon surface of the substrate 200 at the indent region 216 is exposed, which subsequently forms the gate insulating layer for high voltage.

The cleaning process may clean the silicon surface of the substrate 200 to subsequently form the gate insulating layer through an oxidation process. Since the silicon surface at the indent region 216 is pulled down due to the indent region 90 of FIG. 1, the indent region 216 corresponds to the indent region 90 of FIG. 2. In description of a final device structure, the indent region 216 on the substrate 200 substantially corresponds to the initial indent region 90 of FIG. 2.

Figure 9:
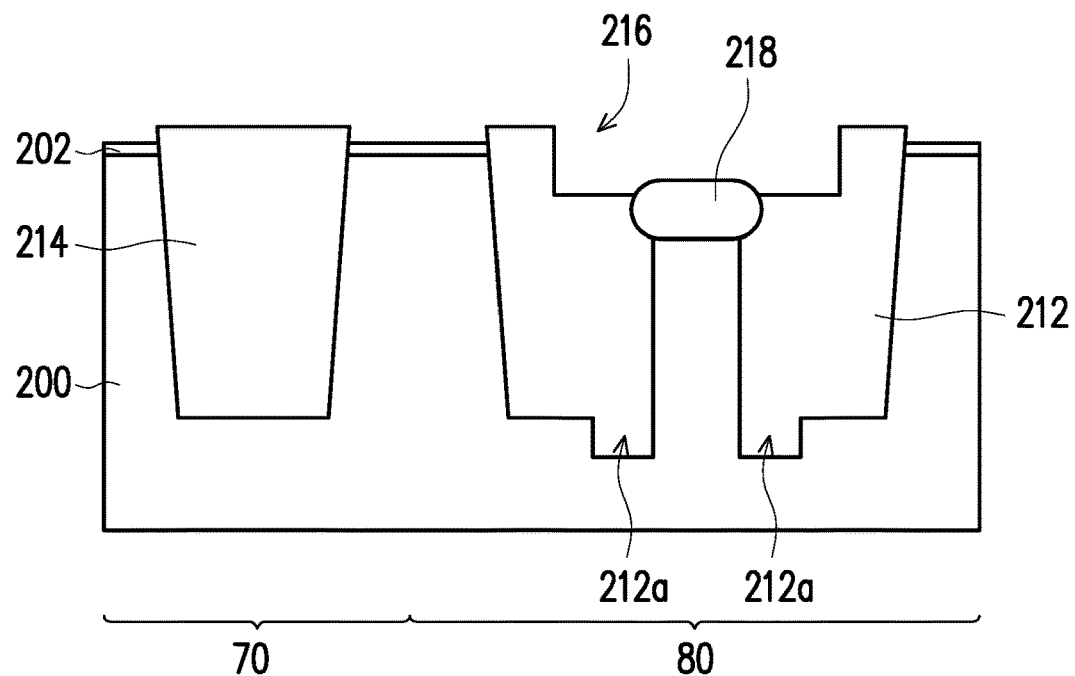

Referring to FIG. 9, the silicon surface of the substrate 200 exposed in the indent region 216 is oxidized to form a gate insulating layer 218. Since the high voltage transistor is operated in the high voltage, a thickness of the gate insulating layer 218 is larger to tolerate the high voltage. The gate insulating layer 218 may be connected and combined with the STI structure 212 to achieve the insulation effect. Based on the thickness requirement of the gate insulating layer 218, the gate insulating layer 218 is substantially partially protruded, however, due to the depth of the indent region 90 of FIG. 2, the height of the gate insulating layer 218 is pulled down to be lower than the height of the substrate 200 at the region outside the indent region 216.

Figure 10:
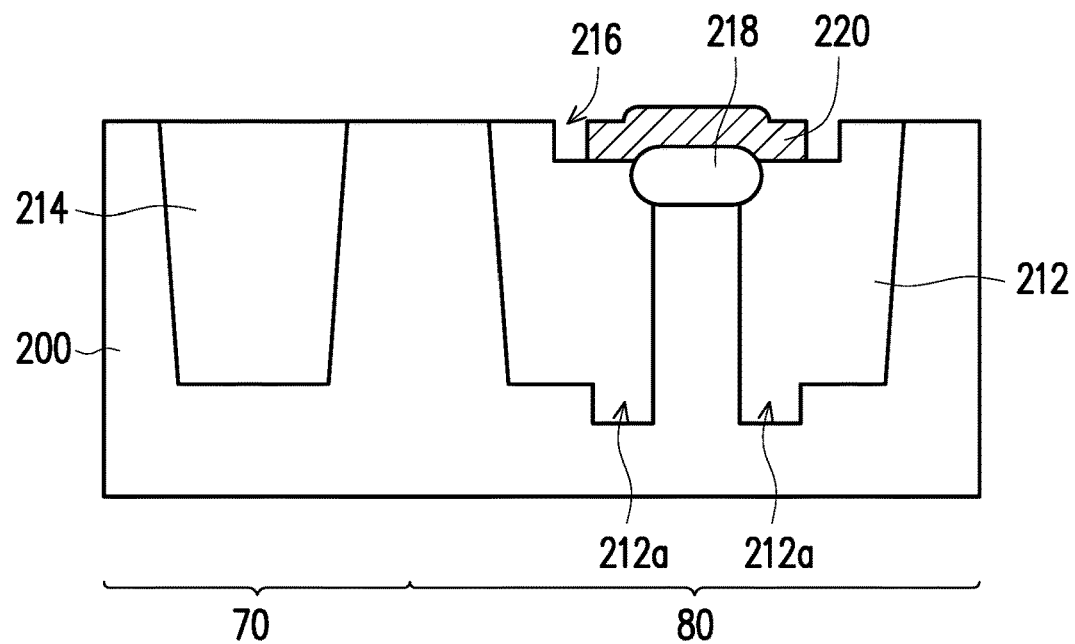

Referring to FIG. 10, in the indent region 216, a gate structure 220 is formed on the gate insulating layer 218. The gate structure 220 may cover a protruding portion of the gate insulating layer 218 and extend to the STI structure 212. Since the height of the gate insulating layer 218 is decreased, the height of the gate structure 220 is accordingly decreased.

Regarding formation of the doped region 104, in an embodiment, the doped region 104 may be formed after the STI structure 212 is formed. However, the doped region 104 is not limited to be formed after formation of the STI structure 212, for example, formation of the doped region 104 may be pre-completed in the original substrates 100, 200. Moreover, as shown in FIG. 1, the high voltage well region of the substrate 100 in the high voltage element region 80 is also pre-completed.

In summary, in fabrication of the STI structure 212, the protruding part 212a protruded at the bottom may smooth the electric field at the bottom of the STI structure 212, so as to effectively avoid concentration of the electric field at the sharp corner of the bottom edge. Moreover, as the height of the gate structure 220 is decreased, partial removal of the top portion of the gate structure 220 due to fabrication of other elements is also avoided, so that the gate structure 220 has a good protection.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A high voltage transistor, comprising:
a substrate, having an indent region;
a doped region, disposed in the substrate at both sides of the indent region;
a shallow trench isolation structure, disposed in the doped region of the substrate at a periphery region of the indent region, wherein a portion of a bottom of the shallow trench isolation structure within the indent region has a protruding part down into the substrate;
a gate insulating layer, disposed on the substrate at a central region of the indent region other than the shallow trench isolation structure, wherein the gate insulating layer has a protruding portion; and
a gate structure, disposed on the gate insulating layer and the shallow trench isolation structure within the indent region, and covering the protruding portion of the gate insulating layer.

2. The high voltage transistor as claimed in claim 1, wherein the gate insulating layer and the shallow trench isolation structure are combined together.

3. The high voltage transistor as claimed in claim 1, wherein a top of the protruding portion of the gate insulating layer is lower than a surface of the substrate outside the indent region.

4. The high voltage transistor as claimed in claim 1, wherein the doped region comprises a doped base region and a heavily doped region, the heavily doped region is located on the top of the doped region, and is located outside the shallow trench isolation structure relative to the gate structure, and the doped base region and the heavily doped region are a first conductive type.

5. The high voltage transistor as claimed in claim 4, further comprising a doped well region surrounding the doped region, wherein the doped well region is a second conductive type opposite to the first conductive type.

6. The high voltage transistor as claimed in claim 4, further comprising a general shallow trench isolation structure located in the substrate at periphery of the doped region for isolating the doped region.

7. The high voltage transistor as claimed in claim 1, wherein a top of the gate structure declines according to a depth of the indent region.

8. The high voltage transistor as claimed in claim 1, wherein the gate structure is a ⌐⌐-shape cap covering the gate insulating layer.

9. The high voltage transistor as claimed in claim 1, wherein the protruding part of the shallow trench isolation structure has a protruding depth according to a depth of the indent region of the substrate.

10. The high voltage transistor as claimed in claim 1, wherein the protruding part of the shallow trench isolation structure has a protruding depth, wherein a ratio for the protruding depth of the protruding part to a depth of the shallow trench isolation structure is between 1/4 and 1/6.

11. The high voltage transistor as claimed in claim 1, wherein the protruding part of the shallow trench isolation structure has a width, and a ratio for the width of the protruding part to a width of the shallow trench isolation structure is between 1/2 and 1/5.

12. A method for fabricating a high voltage transistor, comprising:
providing a substrate, wherein the substrate has an indent region;
forming a shallow trench isolation structure in the substrate at a periphery region of the indent region, wherein a portion of a bottom of the shallow trench isolation structure within the indent region has a protruding part down into the substrate;
forming a gate insulating layer on the substrate at a central region of the indent region other than the shallow trench isolation structure, wherein the gate insulating layer has a protruding portion;
forming a gate structure on the gate insulating layer and the shallow trench isolation structure within the indent region for covering the protruding portion of the gate insulating layer; and
forming a doped region in the substrate at both sides of the indent region for surrounding the shallow trench isolation structure.

13. The method for fabricating the high voltage transistor as claimed in claim 12, wherein the gate insulating layer and the shallow trench isolation structure are combined together.

14. The method for fabricating the high voltage transistor as claimed in claim 12, wherein a top of the protruding portion of the gate insulating layer is lower than a surface of the substrate outside the indent region.

15. The method for fabricating the high voltage transistor as claimed in claim 12, wherein the doped region comprises a doped base region and a heavily doped region, wherein the heavily doped region is located at the top of the doped region, and is located outside the shallow trench isolation structure relative to the gate structure, and the doped base region and the heavily doped region are a first conductive type.

16. The method for fabricating the high voltage transistor as claimed in claim 15, further comprising: forming a doped well region surrounding the doped region, wherein the doped well region is a second conductive type opposite to the first conductive type.

17. The method for fabricating the high voltage transistor as claimed in claim 15, further comprising: forming a general shallow trench isolation structure in the substrate at periphery of the doped region for isolating the doped region.

18. The method for fabricating the high voltage transistor as claimed in claim 12, wherein a top of the gate structure declines according to a depth of the indent region.

19. The method for fabricating the high voltage transistor as claimed in claim 12, wherein the gate structure is a ⌐⌐-shape cap covering the gate insulating layer.

20. The method for fabricating the high voltage transistor as claimed in claim 12, wherein the protruding part of the shallow trench isolation structure has a protruding depth according to a depth of the indent region of the substrate.

* * * * *